(12) United States Patent
Huang et al.

(10) Patent No.: US 7,872,263 B2
(45) Date of Patent: *Jan. 18, 2011

(54) SUBSTRATE STRUCTURE FOR A THIN FILM TRANSISTOR

(75) Inventors: Liang-Ying Huang, Hsinchu (TW); Yi-Kai Wang, Hsinchu (TW); Tarng-Shiang Hu, Hsinchu (TW); Jia-Chong Ho, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 421 days.

This patent is subject to a terminal disclaimer.

(21) Appl. No.: 11/491,192

(22) Filed: Jul. 24, 2006

(65) Prior Publication Data

US 2007/0059868 A1    Mar. 15, 2007

(30) Foreign Application Priority Data

Sep. 14, 2005    (TW) .............................. 94131733 A

(51) Int. Cl.
 *H01L 29/10* (2006.01)
(52) U.S. Cl. .................. 257/66; 257/59; 257/E21.036; 438/160
(58) Field of Classification Search .................. 257/59, 257/E21.036, 66; 438/149, 151, 155, 157, 438/160, 161
See application file for complete search history.

(56) References Cited

U.S. PATENT DOCUMENTS

| 6,245,602 | B1 * | 6/2001 | Ho et al. ...................... 438/158 |
| 6,380,009 | B1 * | 4/2002 | Battersby ..................... 438/161 |
| 6,764,885 | B2 * | 7/2004 | Huang et al. ................. 438/161 |
| 2002/0182785 | A1 * | 12/2002 | Miyairi ........................ 438/149 |
| 2003/0197207 | A1 | 10/2003 | Yang |
| 2004/0113152 | A1 | 6/2004 | Kim et al. |
| 2005/0148123 | A1 * | 7/2005 | Mao-Tsum .................. 438/158 |

FOREIGN PATENT DOCUMENTS

| CN | 1677626 A | 10/2005 |
| JP | 58-170065 | 10/1983 |
| TW | 502449 | 9/2002 |
| TW | 1236153 | 7/2005 |

* cited by examiner

*Primary Examiner*—Lex Malsawma
*Assistant Examiner*—Robert Huber
(74) *Attorney, Agent, or Firm*—Rabin & Berdo, P.C.

(57) ABSTRACT

A method of TFT (Thin Film Transistor) manufacturing and a substrate structure are provided. The structure includes a substrate and a self-alignment mask. A self-alignment mask on a substrate is first manufactured and then the self-alignment mask may synchronously extend with the substrate during the thermal process. When an exposure light source is provided on the side without a TFT formed, the self-alignment mask can overcome the problem that when a plastic substrate extends, the positions of the source and drain to be formed on the plastic substrate are incorrect, which has a great effect on the accuracy of alignment. As the result, the positions of the source and drain can be defined accurately.

2 Claims, 17 Drawing Sheets

SUBSTRATE STRUCTURE FOR A THIN FILM TRANSISTOR

CROSS-REFERENCE TO RELATED APPLICATIONS

This non-provisional application claims priority under 35 U.S.C. §119(a) on Patent Application No(s). 094131733 filed in Taiwan, R.O.C. on Sep. 14, 2005, the entire contents of which are hereby incorporated by reference.

BACKGROUND

1. Field of Invention

The invention relates to a method of manufacturing a thin film transistor and a substrate structure thereof.

2. Related Art

In recent years, the use of computers and the internet has provided another access to information. People have become more familiar with gaining their information from computers rather than books. However, the way people used to read is not easy to change; therefore paper still plays an important role as an information carrier. With the development of display technology, a display can be lighter, thinner, and more portable and flexible. For example, the development of electronic paper has attracted many investors' attention. As a result, many companies have been rushing to develop this kind of technique so as not to miss another "paper revolution."

The organic thin film transistor (OTFT) is designed by choosing an appropriate organic material that is suitable for being the transistor material of an electronic device. For example, when a panel consisting of the OTFT is bended, the property of the OTFT can remain the same and the image displayed will not be affected. Therefore, the OTFT technique accelerates the achievement of flexible electronic products, such as a flexible display. Also, because a plastic substrate is transparent, light, thin, impact resistant, flexible and suitable for the roll to roll ink injecting high efficiency process, an increasing tendency is to use a plastic substrate to form an OTFT thereon when manufacturing a flexible display or logical device. However, there is not only the problem of how to improve the oxygen and water permeability of the substrate in the plastic substrate process, but also the problem of inaccurate alignment caused by the varied size of the substrate during solvent rinsing and high temperature process. Thus, this process is difficult and causes a low yield.

FIG. 1 is a conventional organic thin film transistor which uses a plastic substrate as a base. In order to improve production efficiency, a large size plastic substrate will form many thin film transistors thereon at once. For process control and management purposes, the large size plastic substrate will be divided into several blocks, such as P02, P03, P04, P05, P06 . . . , and each block will further be divided into several units. For example, the P06 block can further be divided into A0, A1 . . . , A8, G0, G1 . . . , and G8 units. Besides, an alignment area 92 will be provided in each process as a reference for alignment.

FIG. 2 is a diagram showing a conventional plastic substrate with variation in size after the thermal process in the thin film transistor manufacturing process. Take the P06 block as an example; the A0, A8, G0, G8 units are located at four corners of the P06 block respectively. By adding the imagined vertical and horizontal supplementary lines, it is found that the four units have different extents after the thermal process, therefore producing a vertical offset of D1 and a horizontal offset of D2. These offsets may seriously affect the accuracy of the alignment and may further make the thin film transistors unstable or inconsistent if the inaccuracy problem is not solved. Besides, because different types of plastic substrate have different extents of thermal expansion, it complicates the process and increases the cost if a different plastic substrate is applied every time and a different mask has to be provided.

SUMMARY

The invention provides a method of forming a self-alignment mask on the front or back surface of a substrate, where a self-alignment back exposure may proceed to expose the source, the drain or the gate. Accordingly, changing the mask design and driving system becomes unnecessary. Because the self-alignment mask is made by metal, using it to define the channel of the active layer can not only prevent the backlight from producing an optical current but can also reflect this backlight to the backlight system. Thus, the light is recycled and backlight efficiency can be improved.

By replacing the conventional projecting mask, used for making the source and drain of transistor, with a self-alignment mask mounted on the substrate, and because the self-alignment mask can synchronously extend/contract with the substrate, the self-alignment mask can self align and determine the position for the source and the drain of the transistor. Therefore, the problem occurring with the projecting mask that the source and drain cannot be clearly defined due to substrate thermal expansion/contraction can be solved by this thin film transistor manufacturing method of the invention.

To achieve the above object, an embodiment of a method for manufacturing a TFT includes: providing a substrate having a first surface and a second surface where the first surface is used for forming a TFT thereon, and the TFT includes a source, a drain, and a gate; forming an opaque thin film on the second surface; processing the opaque thin film to form a first mask; forming a gate on the first surface; forming a transparent insulation layer on the gate and the first surface; forming a transparent electrode layer on the transparent insulation layer; forming a photo resist layer on the transparent electrode layer; providing an exposing light source at the side of the second surface; the exposing light source defines the positions of the source and the drain on the transparent electrode layer with the first mask; forming the source and the drain by processing the transparent electrode layer; and forming an active layer disposed between the source and the drain and electrically connecting them.

According to the invention, another embodiment of a method for manufacturing a TFT includes: providing a substrate having a first surface and a second surface where the first surface is used for forming a TFT thereon, and the TFT includes a source, a drain, and an opaque gate; forming the gate on the first surface; forming a transparent insulation layer on the opaque gate and the first surface; forming a transparent electrode layer on the transparent insulation layer; forming a negative type photo resist layer on the transparent electrode layer; providing an exposing light source at the side of the second surface; the exposing light source defines the channel width of the TFT with the opaque gate; processing the transparent electrode layer to form the source and the drain; and forming an active layer disposed between the source and the drain and electrically connecting them.

According to the invention, an embodiment of a substrate structure for a TFT used for manufacturing the TFT includes: a substrate with a first surface and a second surface; and a self-alignment mask mounted on the first surface or the second surface.

Through the invention the following advantages can be achieved:

1. The process yield can be improved. Because the alignment inaccuracy occurring when defining the source and the drain due to the substrate thermal expansion offset can be reduced by the self-alignment mask.
2. Backlight efficiency can be improved. Because a metal film or a metal oxide film is used as the self-alignment mask, when a light is provided from a backlight module it is reflected by the metal film to enhance lighting efficiency.
3. A better semiconductor property can be obtained. Because the alignment problem has been solved by this invention, a source and drain of a transistor therefore can be formed at the precise position as well as the active layer, and as a result all elements of the device are unified.
4. Cost can be reduced. The invention can not only improve the yield but can also prevent producing costs in manufacturing additional specific masks.

BRIEF DESCRIPTION OF THE DRAWINGS

The present invention will become more fully understood from the detailed description given below, which is for illustration only and thus is not limitative of the invention, wherein.

DETAILED DESCRIPTION

First Embodiment

A TFT manufacturing method (M10) according to this embodiment is particularly suitable for a display having a backlight module. In order to enhance the backlight module's lighting efficiency, the TFT manufacturing method (M10) uses a first mask 21 which is complementary to the source 61 and the drain 62 of the TFT in position, measure of area and shape; and a negative type photo resist layer 70 to define the source 61 and the drain 62 of a TFT.

Figure 1:
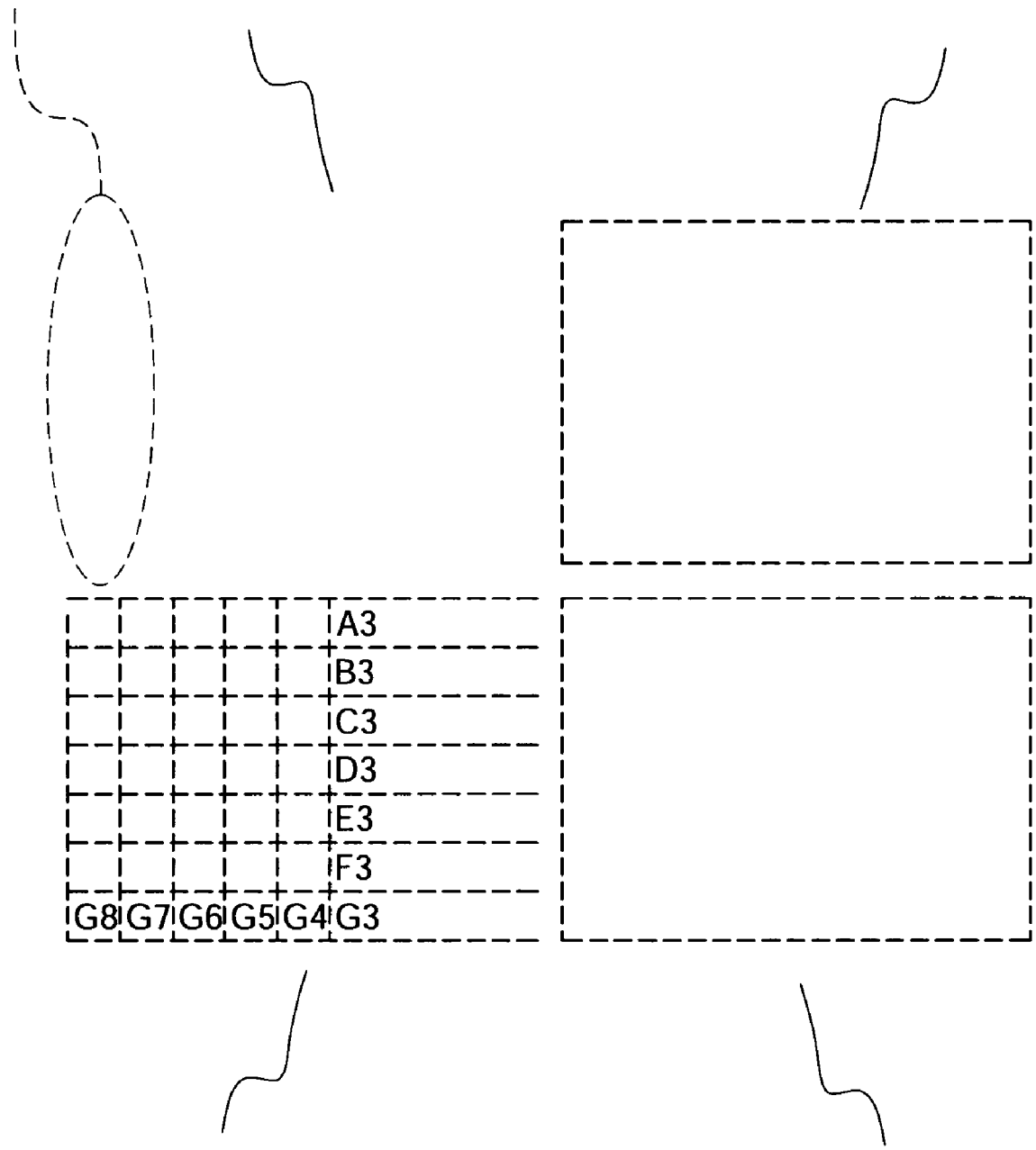
FIG. 1 is a diagram showing a conventional organic thin film transistor using a plastic substrate as base.
Figure 2:
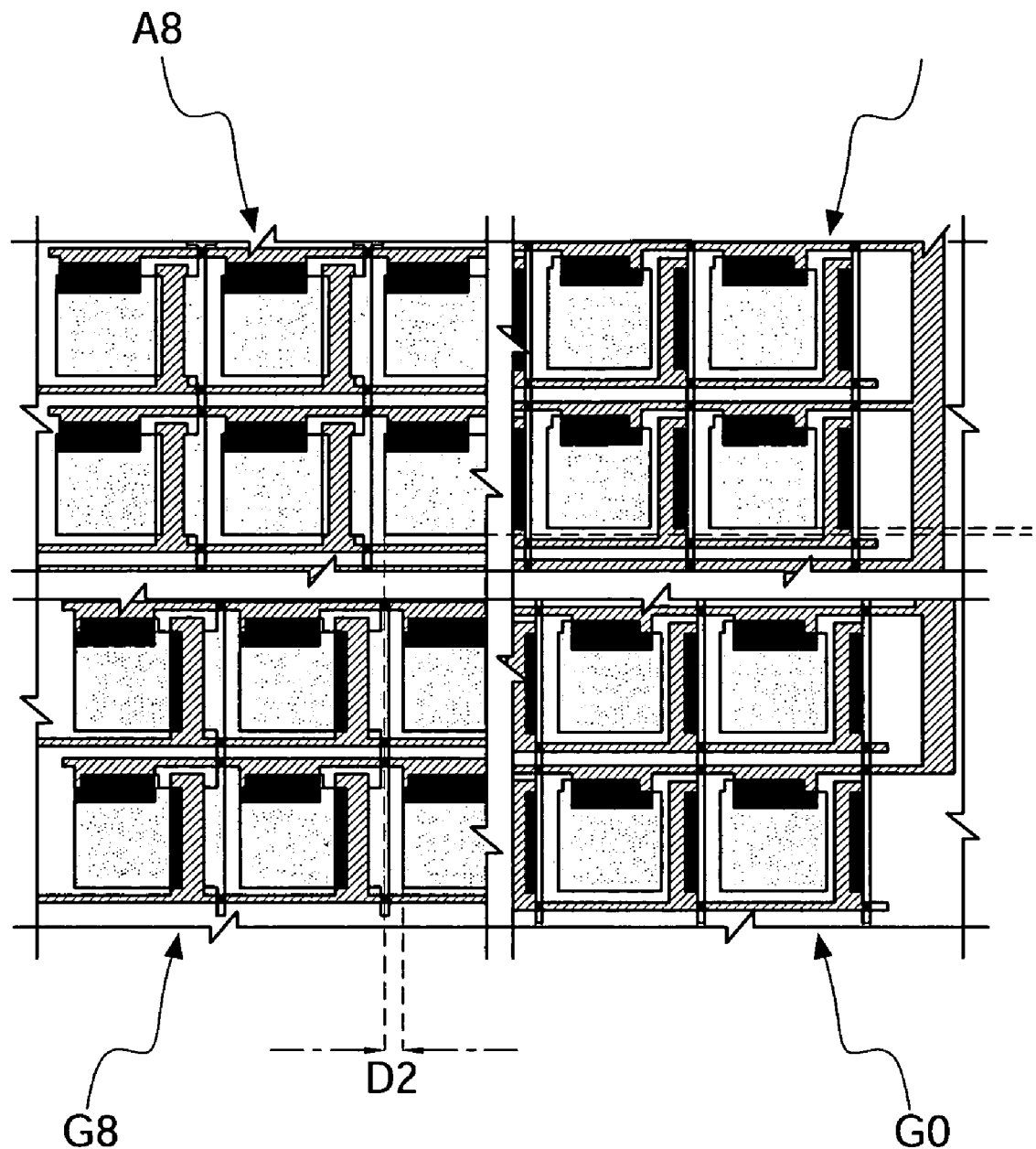
FIG. 2 is a diagram showing a conventional plastic substrate with variation in size before and after the thermal process in the thin film transistor process.
Figure 3A:
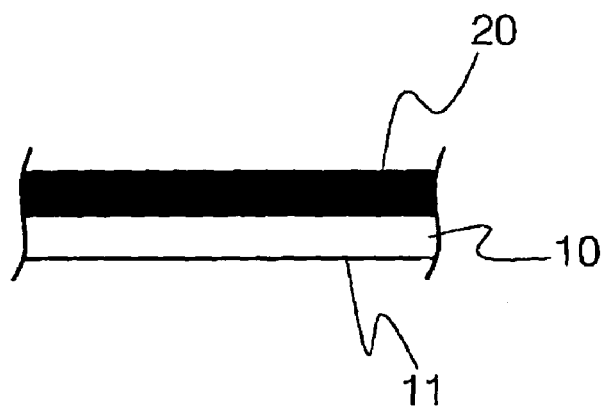
FIG. 3A is a diagram showing an opaque thin film forming on the second surface of a substrate.

Please refer to FIG. 3A, which is a diagram showing a second surface of a substrate forming an opaque thin film thereon. In this embodiment, first provide a substrate 10 for manufacturing a TFT thereon. The substrate 10 has a first surface 11 and a second surface 12 on which is formed a transistor including a source 61, a drain 62, and a gate 41. Then the second surface 12, where no TFT forms, has an opaque thin film 20 forming thereon for manufacturing the first mask 21.

Figure 3B:
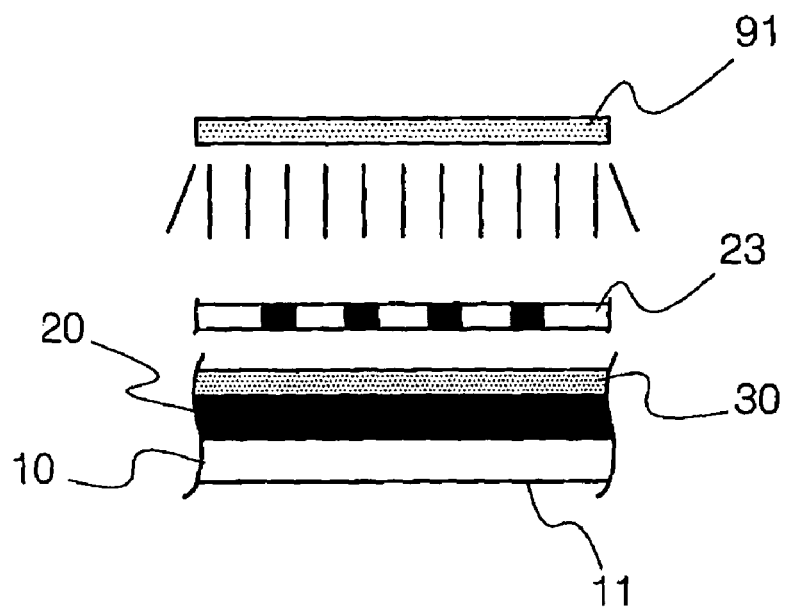
FIG. 3B is a diagram showing a first mask produced by the photolithography process.

Please refer to FIG. 3B, which is a diagram showing a first mask manufactured by a photolithography process. First a photo resist layer 30 is formed on the opaque thin film 20. Then a third mask 23 is used and the exposing, developing, etching, and photo resist stripping processes proceed to form a first mask 21 that has a complementary position, measure of area and shape to the source 61 and the drain 62 of the TFT. When a TFT is manufactured, the first mask 21 synchronously extends with the substrate because the substrate adhering to the first mask 21 brings it to extend during the thermal process. Therefore the position of the source 61 and the drain 62 can be synchronously and automatically self defined and aligned.

Figure 3C:
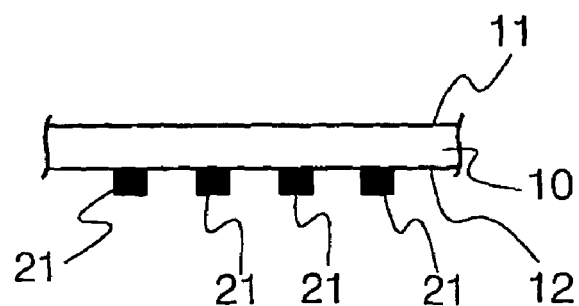
FIG. 3C is a diagram showing the reverse side of the substrate after the first mask is formed.
Figure 3D:
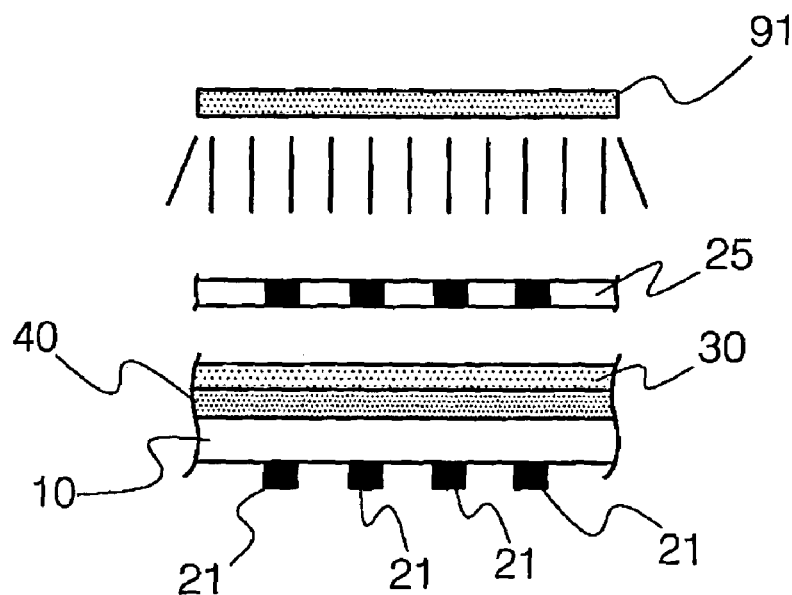
FIG. 3D is a diagram showing a gate forming on the first surface of the substrate by the photolithography process.

Please refer to FIG. 3C, which is a diagram showing the reverse side of the substrate after the first mask is formed. Also refer to FIG. 3D, which is a diagram showing a gate forming on the first surface of the substrate by a photolithography process. After the first mask 21 is completed, reverse the substrate 10 and form a gate thin film 40 on the first surface 11. Next, form a photo resist layer 30 on the gate thin film 40. A fifth mask 25 is then used and the exposing, developing, etching, and photo resist stripping processes proceed to form the gate 41.

Figure 3E:
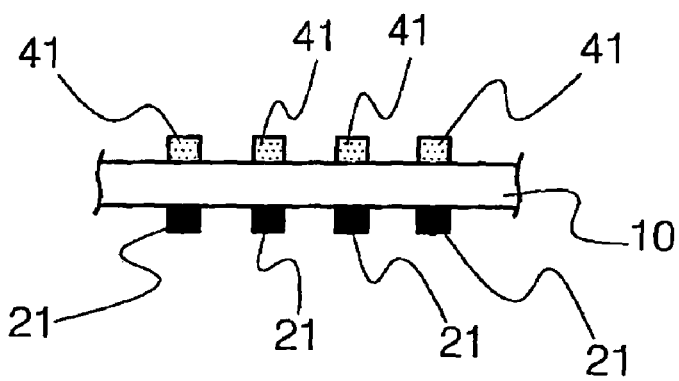
FIG. 3E is a diagram showing the completed gate.
Figure 3F:
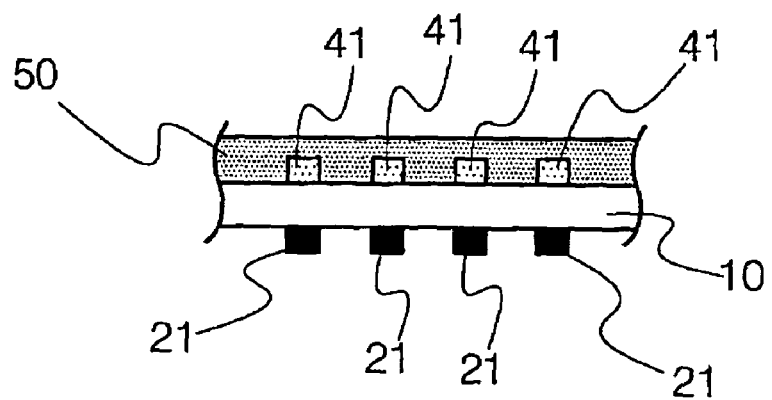
FIG. 3F is a diagram showing a transparent insulation layer forming on the gate and the first surface.
Figure 3G:
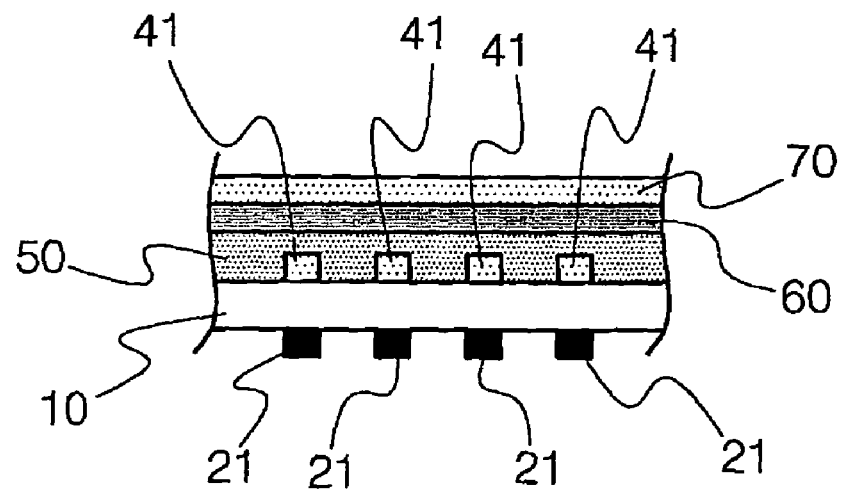
FIG. 3G is a diagram showing a transparent electrode layer forming on the transparent insulation layer and a negative type photo resist layer forming on the transparent electrode layer.

Please refer to FIG. 3E, which is a diagram showing a structure after the gate is completed. Please refer to FIG. 3F, which is a diagram showing a transparent insulation layer forming on the gate and the first surface. Please refer to FIG. 3G, which is a diagram showing a transparent electrode layer forming on the transparent insulation layer and a negative photo resist forming on the transparent electrode layer. After the gate 41 is completed, a transparent insulation layer 50 is formed on the gate 41 and the first surface 11. Next, a transparent electrode layer 60 is formed on the transparent insulation layer 50, followed by forming a negative type photo resist layer 70 on the transparent electrode layer 60. Because the position, measure of area and shape of the first mask 21 are complementary to the source 61 and the drain 62, the photo resist layer used for manufacturing the source 61 and the drain 62 in this embodiment is a negative type photo resist layer 70.

Figure 3H:
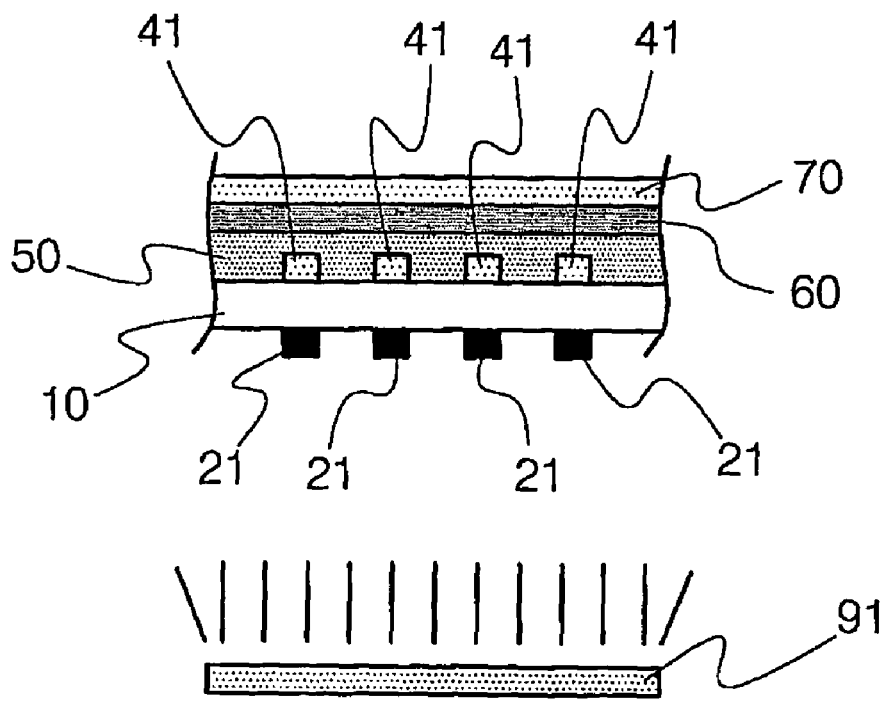
FIG. 3H is a diagram showing an exposure light source provided at the side of the second surface to define the positions of the source and the drain of a thin film transistor.
Figure 3I:
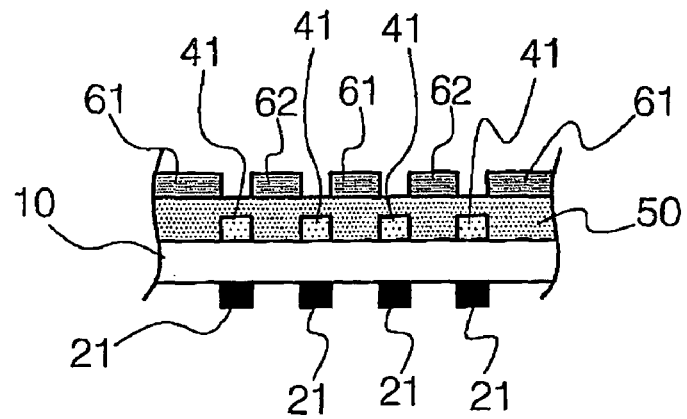
FIG. 3I is a diagram showing a transparent insulation layer processed to form the source and the drain.

Please refer to FIG. 3H, which is a diagram showing that an exposure light source is provided at a side of the second surface to define the positions of the source and the drain of the TFT. Please refer to FIG. 3I, which is a diagram showing the transparent electrode layer processed to form the source and the drain. After the negative type photo resist layer 70 is completed, provide an exposure light source 91 at the side of the second surface 12. Then the negative type photo resist layer 70 works with the first mask 21 and the exposing, developing, etching, and photo resist stripping processes proceed to process the transparent electrode layer 60 to form the source 61 and the drain 62.

Figure 3J:
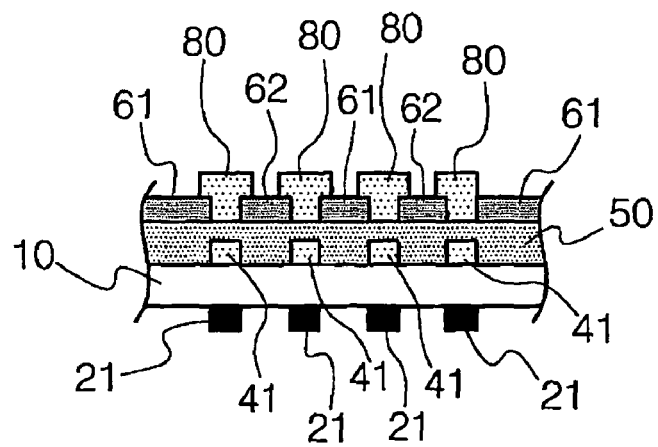
FIG. 3J is a diagram showing an active layer formed between the source and the drain of the thin film transistor.

Please refer to FIG. 3J, which is a diagram showing an active layer forming between the source and the drain of the TFT. After the source 61 and the drain 62 are formed, a semiconductor thin film is formed on the source 61 and the drain 62, followed by forming a photo resist on the semiconductor thin film (the semiconductor thin film and the photo resist are not shown). Next, the exposing, developing, etching, and photo resist stripping processes proceed to form an active layer 80, which is disposed between the source 61 and the drain 62 and electrically connects the source 61 and the drain 62.

Figure 4:
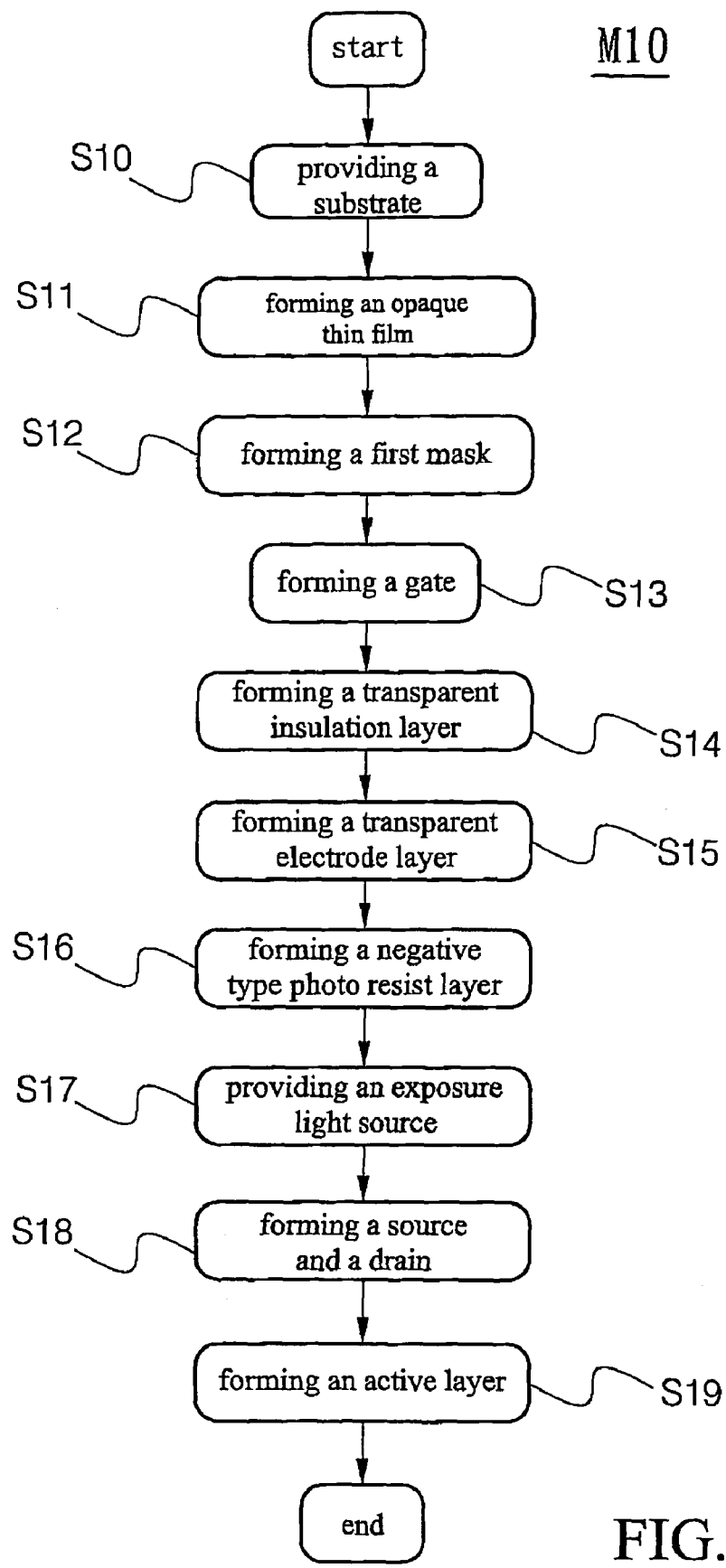
FIG. 4 is a flow chart of an embodiment of a method for manufacturing a thin film transistor according to the invention.

Please refer to FIG. 4, which is a flow chart showing an embodiment of a method for manufacturing a TFT according to the invention. The method (M10) includes the following steps: first providing a substrate, which has a first surface and a second surface (S10); forming an opaque thin film on the second surface of the substrate (S11); processing the opaque thin film to form a first mask, where the first mask can be used to define the positions of the source and drain of the TFT while manufacturing the TFT on the first surface (S12); forming a gate on the first surface; disposing the gate at a predetermined position between the source and the drain (S13); forming a transparent insulation layer on the gate and the first surface (S14); forming a transparent electrode layer on the transparent insulation layer (S15); forming a negative type photo resist layer on the transparent insulation layer (S16); providing an exposure light source at a side of the second surface; the light source works with the first mask to define the positions of the source and drain (S17); processing the transparent electrode layer to form the source and the drain of a TFT (S18); and forming an active layer between the source and the drain; the active layer electrically connects the source and the drain (S19).

Second Embodiment

A TFT manufacturing method (M20) according to this embodiment is particularly suitable for a reflective display. In order to increase the reflective area of the display, the TFT manufacturing method (M20) uses a second mask 22 which is the same with the source 61 and the drain 62 of the TFT in position, measure of area and shape; and a transparent gate 43 and a positive type photo resist layer 71 to define the source 61 and the drain 62 of a TFT.

Figure 5A:
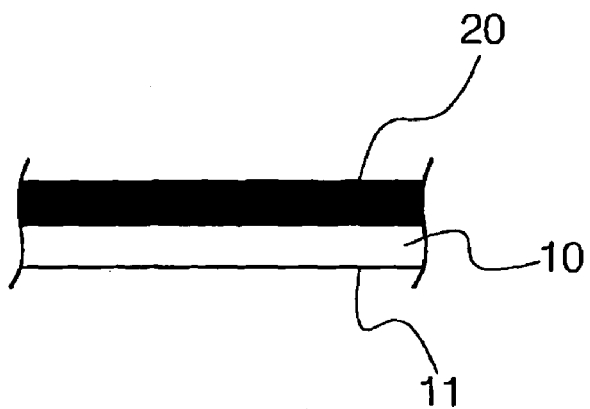
FIG. 5A is a diagram showing an opaque thin film forming on the second surface of a substrate.

Please refer to FIG. 5A, which is a diagram showing a second surface of a substrate forming an opaque thin film thereon. In this embodiment, first provide a substrate 10 for manufacturing a TFT thereon. The substrate 10 has a first surface 11 and a second surface 12. The first surface is used for forming a transistor including a source 61, a drain 62, and a transparent gate 43 formed thereon. Then the second surface 12, where not used to form TFT, has an opaque thin film 20 forming thereon for manufacturing the second mask 22.

Figure 5B:
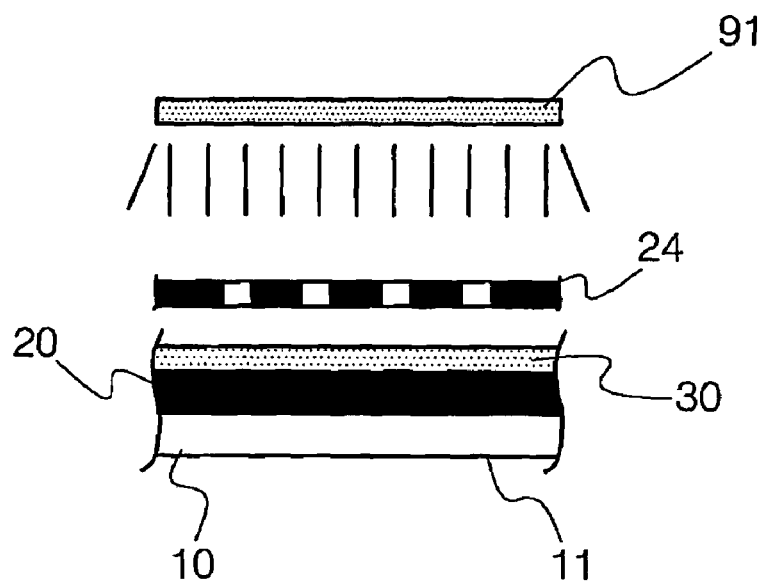
FIG. 5B is a diagram showing a second mask produced by the photolithography process.

Please refer to FIG. 5B, which is a diagram showing the manufacture of a second mask by a photolithography process. First a photo resist layer 30 is formed on the opaque thin film 20. Then a fourth mask 24 is used and the exposing, developing, etching, and photo resist stripping processes proceed to form a second mask 22 that has the same position, measure of area and shape as the source 61 and the drain 62 of the TFT. When a TFT is manufactured, the second mask 22 synchronously extends with the substrate because the substrate adhering to the second mask 22 brings it to extend during the thermal process. Therefore the position of the source 61 and the drain 62 can be synchronously and automatically self defined and aligned.

Figure 5C:
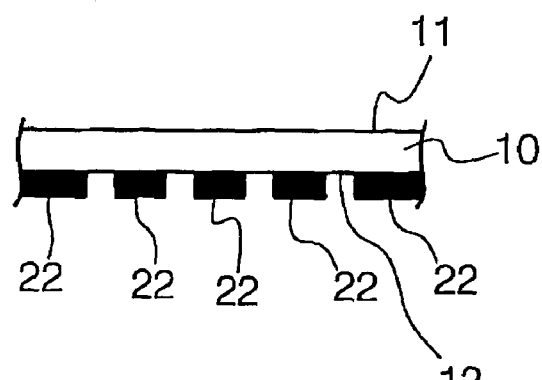
FIG. 5C is a diagram showing a substrate reversed after the second mask is completed.
Figure 5D:
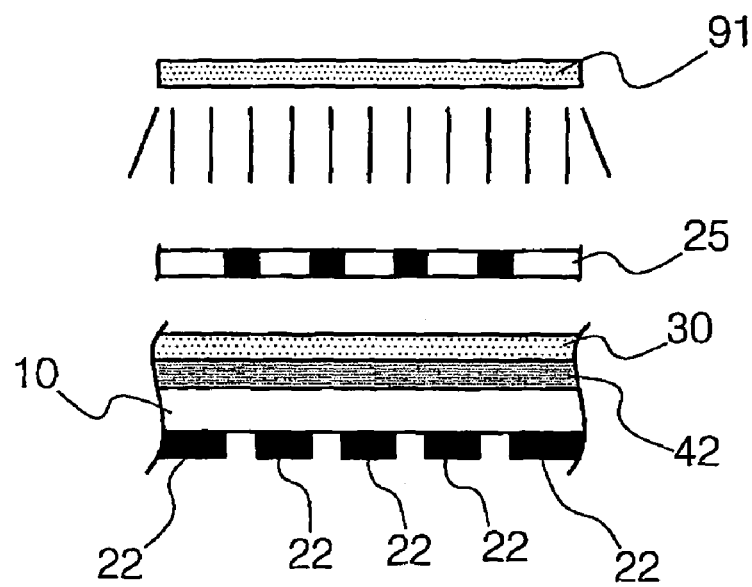
FIG. 5D is a diagram showing a transparent gate produced on the first surface of the substrate by the photolithography process.

Please refer to FIG. 5C, which is a diagram showing the reverse side of the substrate after the second mask is formed. Please refer to FIG. 5D, which is a diagram showing a transparent gate forming on the first surface of the substrate by a photolithography process. After the second mask 22 is completed, reverse the substrate 10 and form a transparent gate thin film 42 on the first surface 11. Next, form a photo resist layer 30 on the transparent gate thin film 42. A fifth mask 25 is then used and the exposing, developing, etching, and photo resist stripping processes proceed to form the transparent gate 43.

Figure 5E:
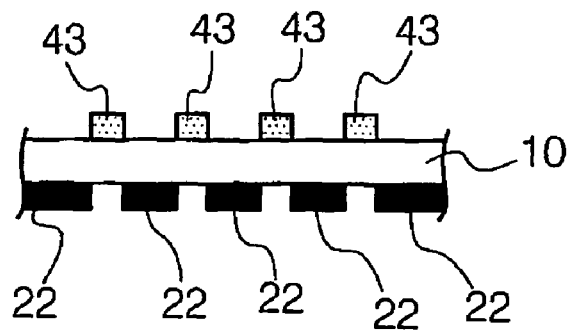
FIG. 5E is a diagram showing the completed transparent gate.
Figure 5F:
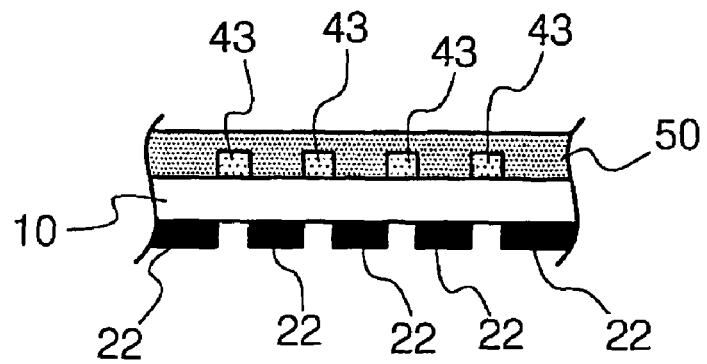
FIG. 5F is a diagram showing a transparent insulation layer forming on the transparent gate and the first surface.
Figure 5G:
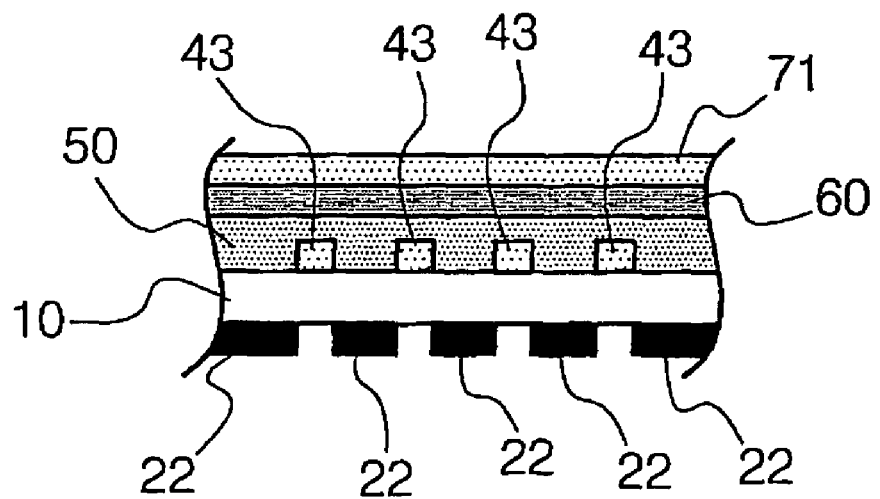
FIG. 5G is a diagram showing a transparent electrode layer forming on the transparent insulation layer and a positive type photo resist layer forming on the transparent electrode layer.

Please refer to FIG. 5E, which is a diagram showing a structure after the transparent gate is completed. Please refer to FIG. 5F, which is a diagram showing a transparent insulation layer forming on the transparent gate and the first surface. Please refer to FIG. 5G, which is a diagram showing a transparent electrode layer forming on the transparent insulation layer and a positive type photo resist layer forming on the transparent electrode layer. After the transparent gate 43 is completed, a transparent insulation layer 50 is formed on the transparent gate 43 and the first surface 11. Next, a transparent electrode layer 60 is formed on the transparent insulation layer 50, followed by forming a positive type photo resist layer 71 on the transparent electrode layer 60. Because the position, measure of area and shape of the second mask 22 are the same as the source 61 and the drain 62, the photo resist layer used for manufacturing the source 61 and the drain 62 in this embodiment is a positive type photo resist layer 71.

Figure 5H:
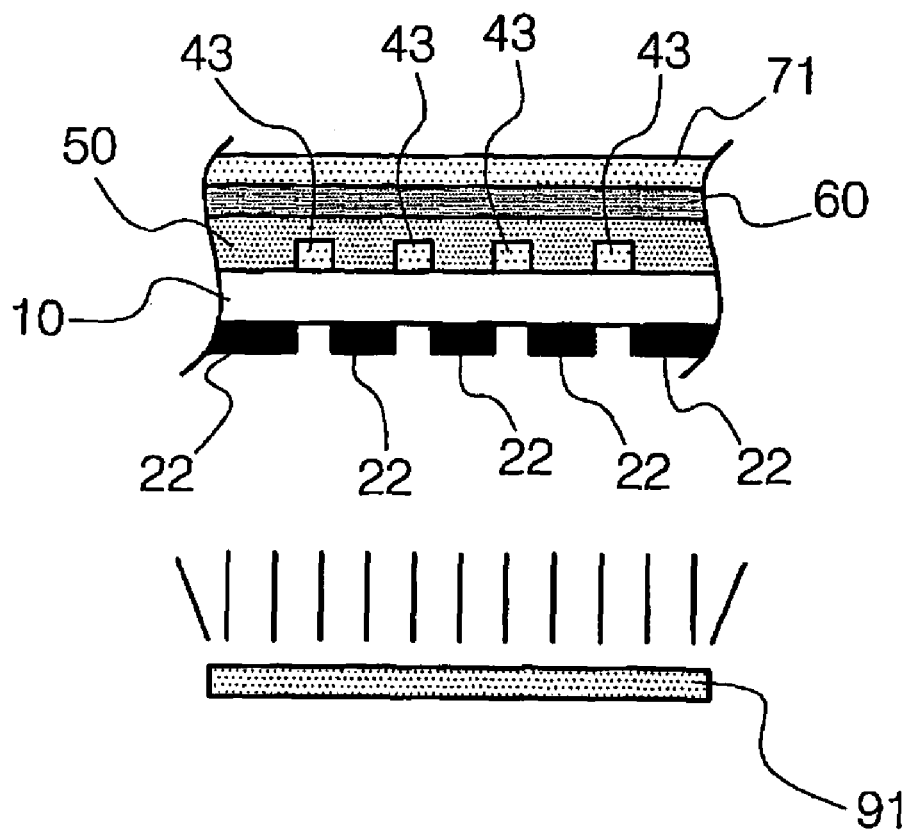
FIG. 5H is a diagram showing an exposure light source provided at the side of the second surface to define the positions of the source and the drain of a thin film transistor.
Figure 5I:
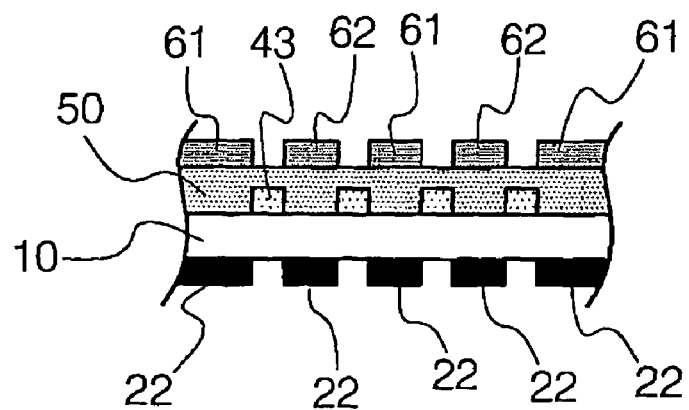
FIG. 5I is a diagram showing a transparent electrode layer processed to form the source and the drain of the thin film transistor.

Please refer to FIG. 5H, which is a diagram showing that an exposure light source is provided at a side of the second surface to define the positions of the source and the drain of the TFT. Please refer to FIG. 5I, which is a diagram showing the processing of the transparent electrode layer to form the source and the drain. After the positive type photo resist layer 71 is completed, provide an exposure light source 91 at the side of the second surface 12. Then the positive type photo resist layer 71 works with the second mask 22 and the exposing, developing, etching, and photo resist stripping processes proceed to process the transparent electrode layer 60 to form the source 61 and the drain 62.

Figure 5J:
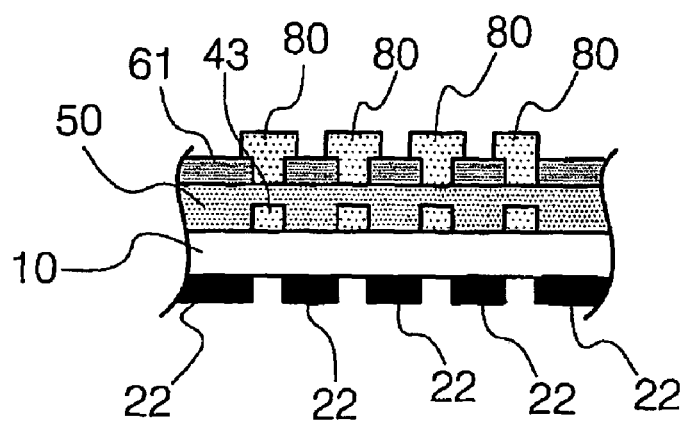
FIG. 5J is a diagram showing an active layer formed between the source and the drain of the thin film transistor.

Please refer to FIG. 5J, which is a diagram showing an active layer forming between the source and the drain of the TFT. After the source 61 and the drain 62 are formed, a semiconductor thin film is formed on the source 61 and the drain 62, followed by forming a photo resist on the semiconductor thin film (the semiconductor thin film and the photo resist are not shown). Next, the exposing, developing, etching, and photo resist stripping processes proceed to form an active layer 80, which is disposed between the source 61 and the drain 62 and electrically connects the source 61 and the drain 62.

Figure 6:
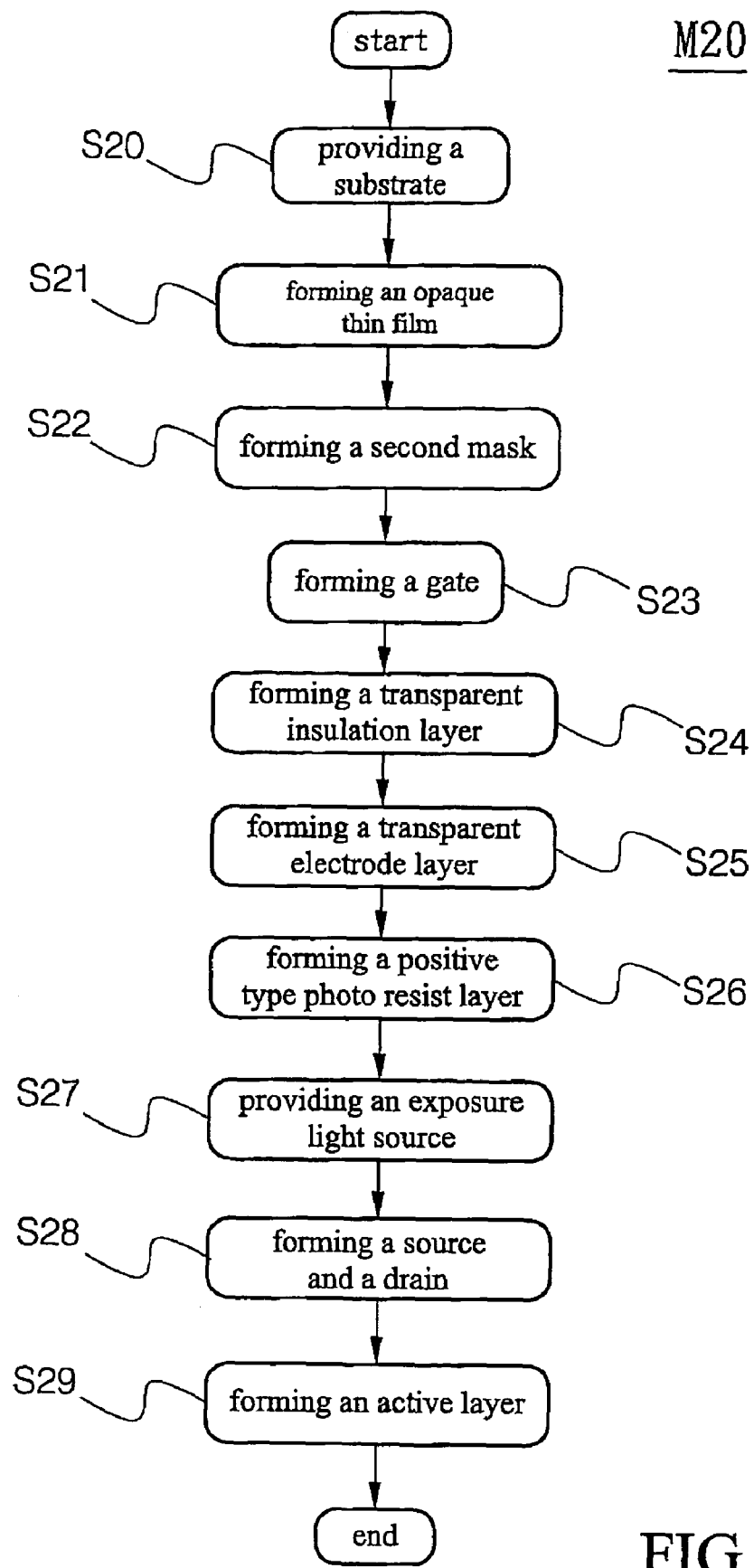
FIG. 6 is a flow chart of another embodiment of a method for manufacturing a thin film transistor according to the invention.

Please refer to FIG. 6, which is a flow chat showing another embodiment of a method for manufacturing a TFT according to the invention. The method (M20) includes the following steps: first providing a substrate, which has a first surface and a second surface (S20); forming an opaque thin film on the second surface of the substrate (S21); processing the opaque thin film to form a second mask, where the second mask can be used to define the positions of the source and drain of the TFT while manufacturing the thin film transistor on the first surface (S22); forming a transparent gate on the first surface (S23); forming a transparent insulation layer on the transparent gate and the first surface (S24); forming a transparent electrode layer on the transparent insulation layer (S25); forming a positive type photo resist layer on the transparent electrode layer (S26); providing an exposure light source at a side of the second surface; the exposure light source works with the second mask to define the positions of the source and drain (S27); processing the transparent electrode layer to form the source and the drain of a TFT (S28); and forming an active layer between the source and the drain; the active layer electrically connects the source and the drain (S29).

Third Embodiment

A TFT manufacturing method (M30) according to this embodiment is particularly suitable for a display that has a backlight module. Like method M10, although this method is also for enhancing the backlight module's lighting efficiency, this method uses an opaque gate 45 as a gate electrode and a self-alignment mask for making the source 61 and the drain 62 at the same time. The opaque gate 45 works with a negative type photo resist layer 70 to define the source 61 and the drain 62 of a TFT.

Figure 7A:
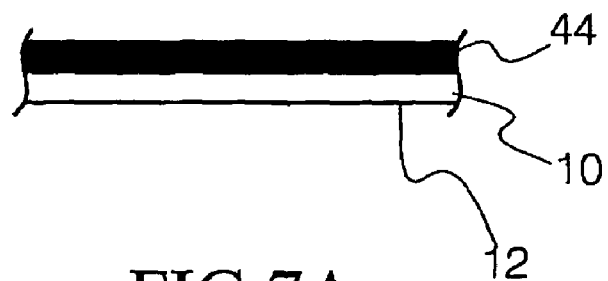
FIG. 7A is a diagram showing an opaque thin film forming on the first surface of a substrate.

Please refer to FIG. 7A, which is a diagram showing a first surface of a substrate forming an opaque gate thin film thereon. In this embodiment, first provide a substrate 10 for manufacturing a TFT thereon. Then an opaque gate thin film 44 is formed on one surface of the substrate 10.

Figure 7B:
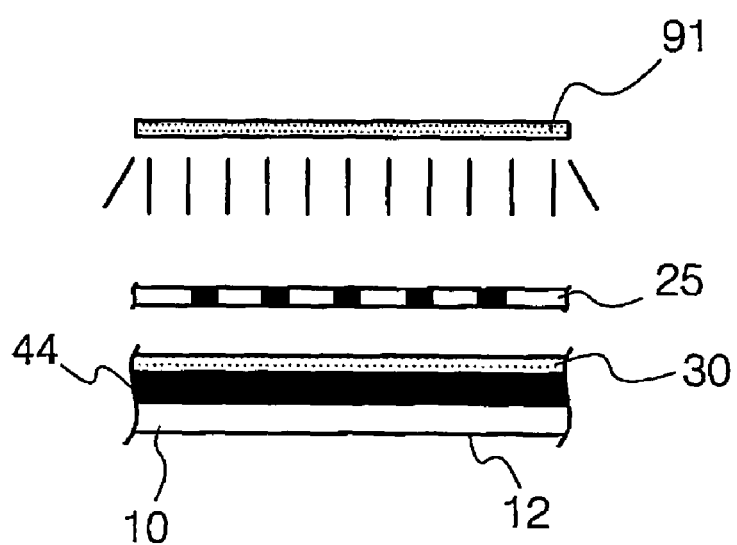
FIG. 7B is a diagram showing an opaque gate thin film processed to form the opaque gate by the photolithography process.

Please refer to FIG. 7B, which is a diagram showing an opaque gate thin film processed to form the opaque gate by the photolithography process. First a photo resist layer 30 is formed on the opaque gate thin film 44. Then a fifth mask 25 is used and the exposing, developing, etching, and photo resist stripping processes proceed to form the opaque gate 45.

Figure 7C:
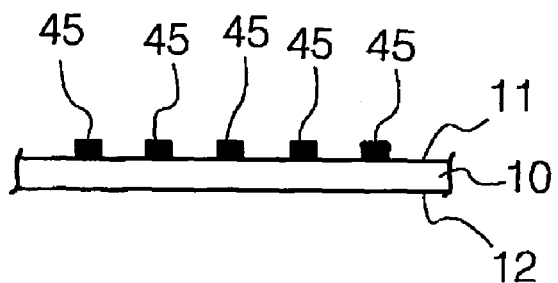
FIG. 7C is a diagram showing the completed opaque gate.
Figure 7D:
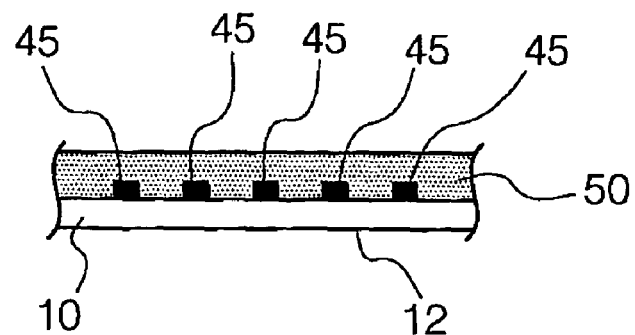
FIG. 7D is a diagram showing a transparent insulation layer forming on the opaque gate and the first surface.
Figure 7E:
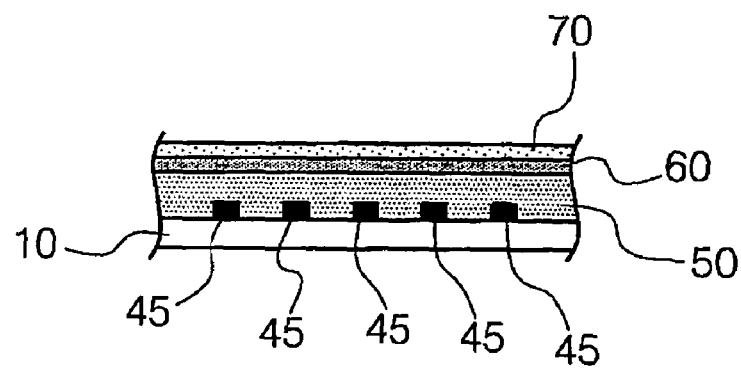
FIG. 7E is a diagram showing a transparent electrode layer forming on the transparent insulation layer and a negative type photo resist layer forming on the transparent electrode layer.

Please refer to FIG. 7C, which is a diagram showing a structure after the opaque gate is completed. Please refer to FIG. 7D, which is a diagram showing a transparent insulation layer forming on the opaque gate and the first surface. Please refer to FIG. 7E, which is a diagram showing a transparent electrode layer forming on the transparent insulation layer and a negative photo resist layer forming on the transparent electrode layer. After the opaque gate 45 is completed, a transparent insulation layer 50 is formed on the opaque gate 45 and the first surface 11. Next, a transparent electrode layer 60 is formed on the transparent insulation layer 50, followed by forming a negative type photo resist layer 70 on the transparent electrode layer 60. Because the opaque gate 45 is used as a mask in this embodiment, the photo resist layer used for manufacturing the source 61 and the drain 62 in this embodiment is a negative type photo resist layer 70.

Figure 7F:
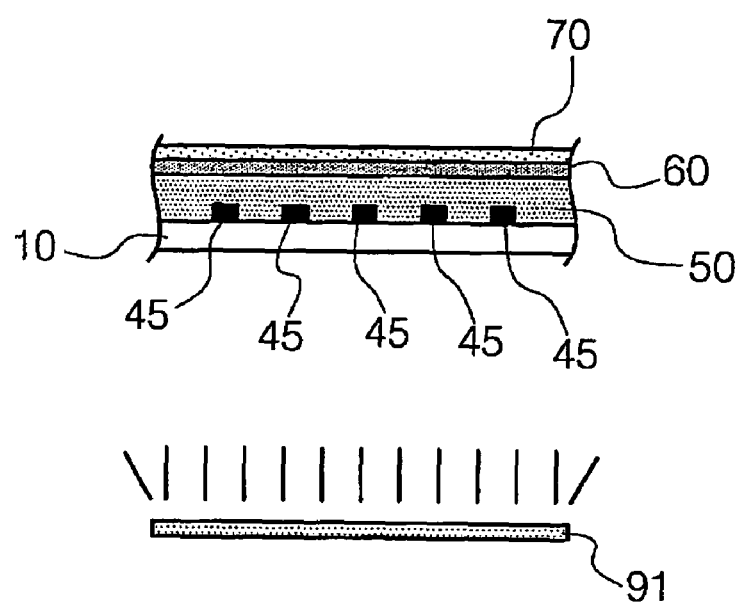
FIG. 7F is a diagram showing an exposure light source provided at the side of the second surface to define the positions of the source and the drain of a thin film transistor.
Figure 7G:
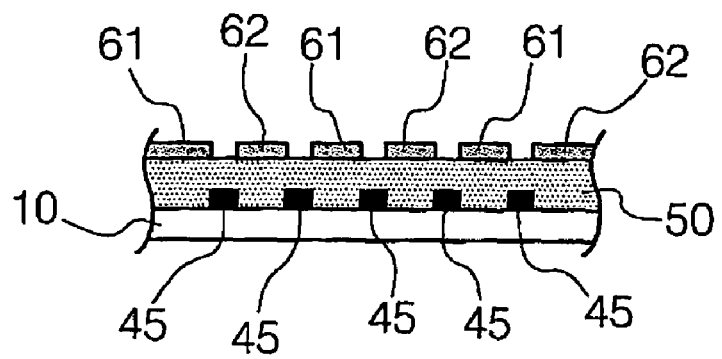
FIG. 7G is a diagram showing a transparent electrode layer processed to form the source and the drain of the thin film transistor.

Please refer to FIG. 7F, which a diagram showing that an exposure light source is provided at a side of the second surface to define the positions of the source and the drain of the TFT. Please refer to FIG. 7G, which is a diagram showing the transparent electrode layer processed to form the source and the drain. After the negative type photo resist layer 70 is completed, provide an exposure light source 91 at a side of the second surface 12. Then the negative type photo resist layer 70 works with the mask of opaque gate 45 and the exposing, developing, etching, and photo resist stripping processes proceed to process the transparent electrode layer 60 to form the source 61 and the drain 62 of a TFT.

Figure 7H:
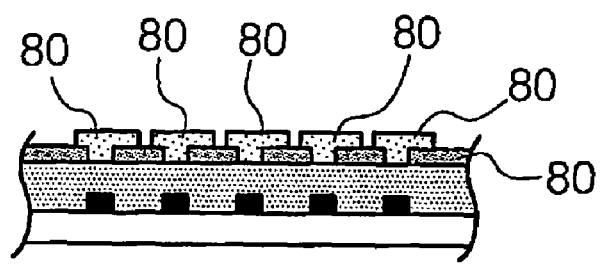
FIG. 7H is a diagram showing an active layer formed between the source and the drain of the thin film transistor.

Please refer to FIG. 7H, which is a diagram showing an active layer forming between the source and the drain of the TFT. After the source 61 and the drain 62 are formed, a semiconductor thin film is formed on the source 61 and the drain 62, followed by forming a photo resist layer on the semiconductor thin film (the semiconductor thin film and the photo resist are not shown). Next, the exposing, developing, etching, and photo resist stripping processes proceed to form an active layer 80.

Figure 8:
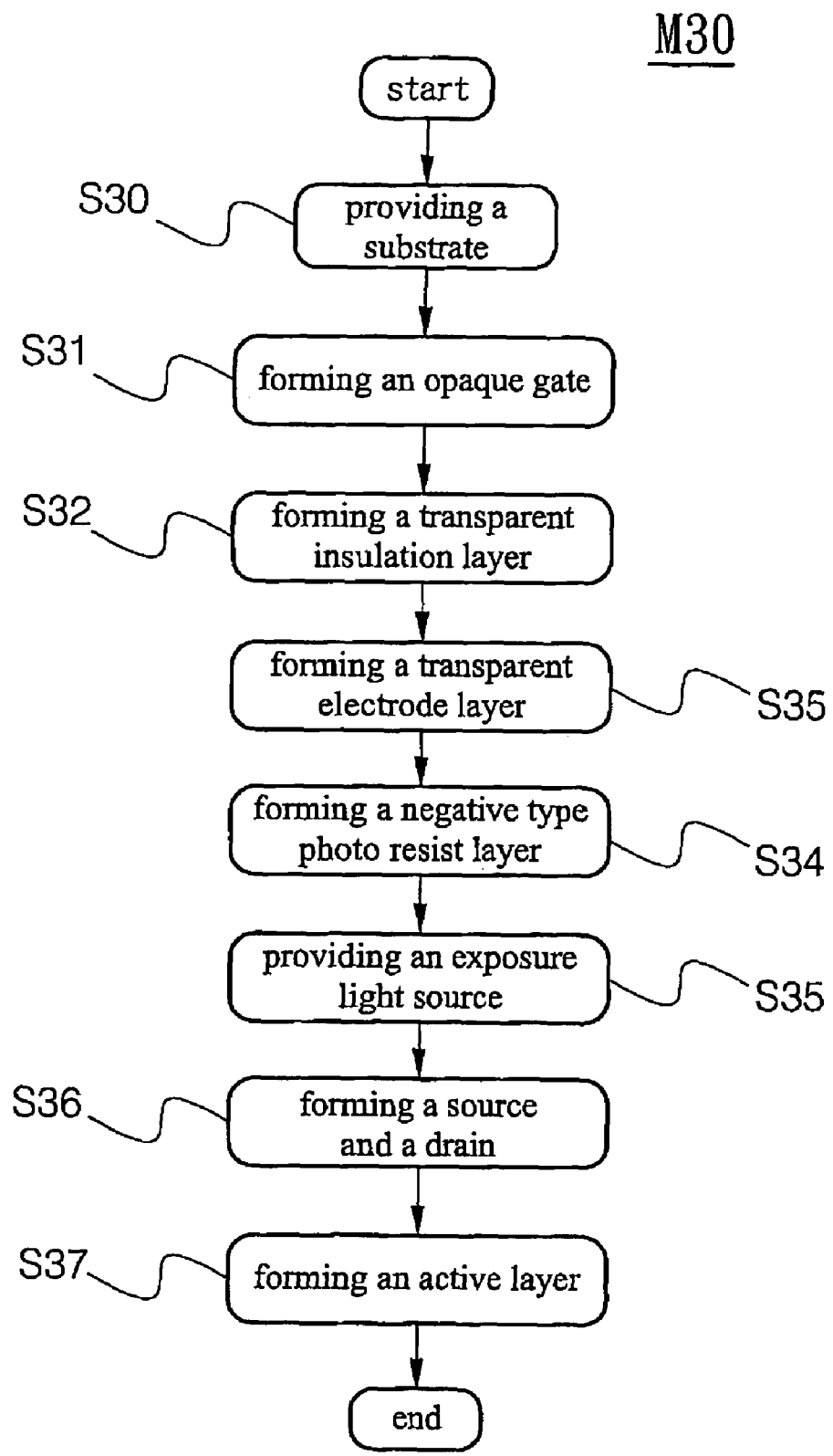
FIG. 8 is a flow chart of still another embodiment of a method for manufacturing a thin film transistor according to the invention.

Please refer to FIG. 8, which is a flow chart showing still another embodiment of a method for manufacturing a TFT according to the invention. The method (M30) includes the following steps: first providing a substrate, which has a first surface and a second surface (S30); forming an opaque gate on the first surface (S31); forming a transparent insulation layer on the opaque gate and the first surface (S32); forming a transparent electrode layer on the transparent insulation layer (S33); forming a negative type photo resist layer on the transparent insulation layer (S34); providing an exposure light source at a side of the second surface; the exposure light source works with the opaque gate to define the channel width of the TFT (S35); processing the transparent electrode layer to form the source and the drain of a TFT (S36); and forming an active layer between the source and the drain, the active layer electrically connecting the source and the drain (S37).

Fourth Embodiment

In this embodiment, a substrate structure for a TFT that applies to a method for manufacturing a TFT includes: a substrate 10 with a first surface 11 and a second surface 12; and a self-alignment mask 26 disposed on the first surface 11 or the second surface 12.

Figure 9:
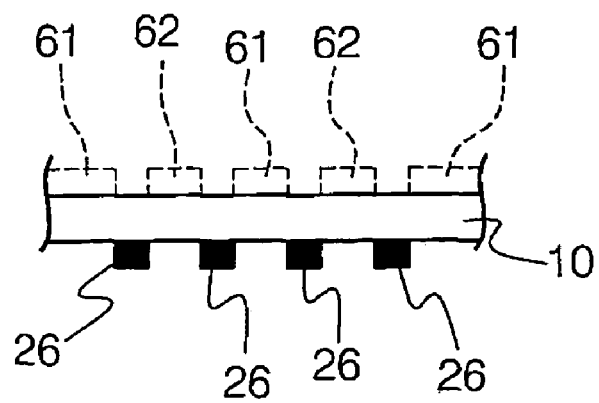
FIG. 9 is a diagram showing the first embodiment of the self-alignment mask.
Figure 10:
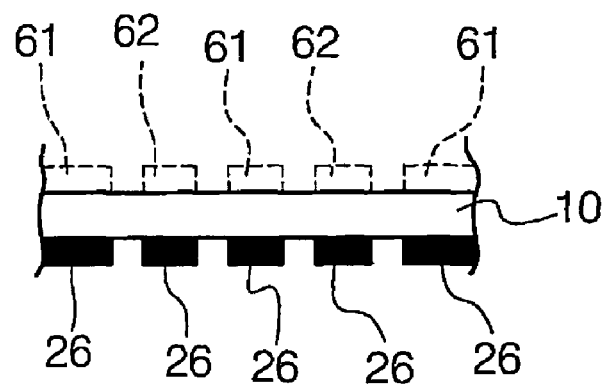
FIG. 10 is a diagram showing the second embodiment of the self-alignment mask.
Figure 11:
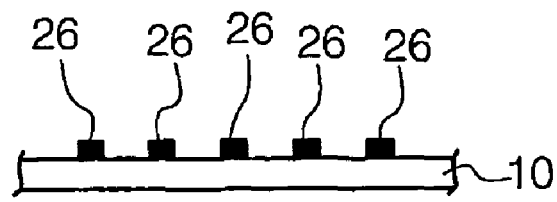
FIG. 11 is a diagram showing the third embodiment of the self-alignment mask.

While a TFT is disposed on the first surface 11, the self-alignment mask 26 of the embodiment is disposed on the other side of the substrate, which is the second surface 12, where not used to form TFT. According to the position, measure of area and shape, the self-alignment mask may have three different types of embodiments. Please refer to FIG. 9, which shows the first embodiment of the self-alignment mask. The self-alignment mask 26 in this first embodiment is a first mask 21, which is disposed on a surface without a TFT thereon. The position, measure of area and the shape of the self-alignment mask 26 are complementary to the source 61 and the drain 62 of the TFT. Please refer to FIG. 10, which shows the second embodiment of the self-alignment mask. The self-alignment mask 26 in this second embodiment is a second mask 22, which is disposed on a surface without a TFT thereon. The position, measure of area and the shape of the self-alignment mask 26 are the same as the source 61 and the drain 62 of the TFT. Please refer to FIG. 11, which shows the third embodiment of the self-alignment mask. The self-alignment mask 26 in this first embodiment is an opaque gate 45 of a TFT.

Because there is a first mask 21 and a second mask 22 forming on the substrate 10 when manufacturing a substrate structure for a TFT, and because the first mask 21 and the second mask 22 are made of a gate thin film 40 or a metal oxide thin film, the light provided by the backlight module is reflected by the first mask 21 and the second mask 22 and therefore enhances the lighting efficiency of the backlight module.

Geneal Description

Below the common elements in the first to fourth embodiments described above are further described.

The methods for manufacturing a TFT (M10, M20, and M30) or substrate structure for a TFT can apply to the general TFT process, and especially to an organic TFT process.

The substrate 10 used in the methods for manufacturing a TFT (M10, M20, M30) may be a glass substrate or an extendible substrate. An extendable substrate is defined as a substrate that extends noticeably under physical factor effects. For example, a plastic substrate will do. Because the plastic substrate has extendable properties under high temperatures, the uses of the first mask 21, the second mask 22, and the opaque gate 45 can further show the property of correctly defining the positions of the source 61 and the drain 62.

In the method for manufacturing a TFT, the opaque thin film 20 may be a metal thin film or a metal oxide thin film. The active layer 80 may be made of an organic or inorganic semiconductor material. The transparent insulation layer 50 may be made of an organic or inorganic material and formed by a printing process or an inorganic deposition process. The active layer 80 may be made of an organic or inorganic semiconductor material.

Figure 3K:
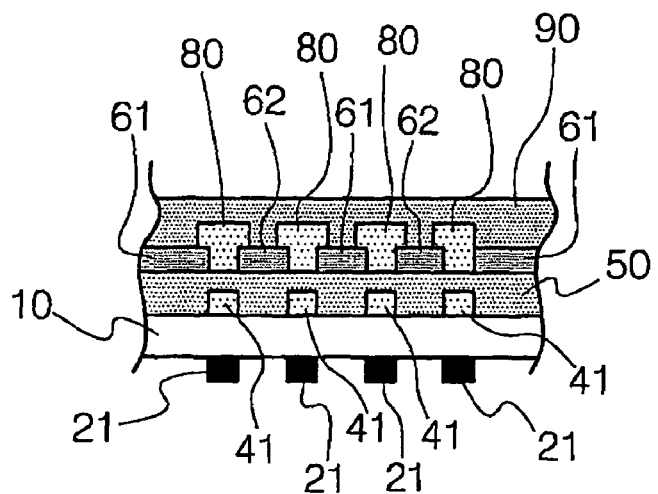
FIG. 3K is a diagram showing an active layer completed in the first embodiment further covered by a passivation layer.
Figure 5K:
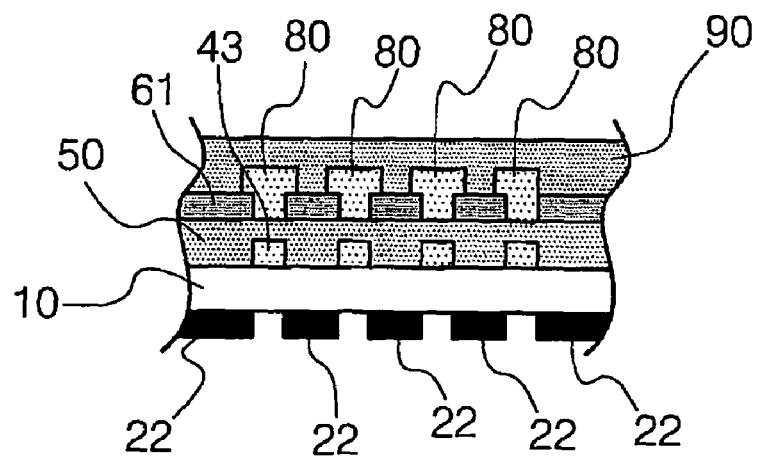
FIG. 5K is a diagram showing an active layer completed in the second embodiment further covered by a passivation layer.
Figure 7I:
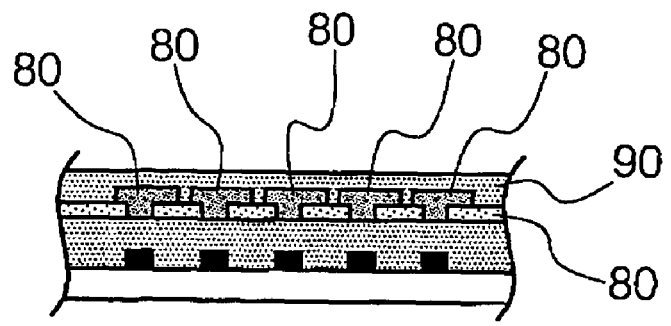
FIG. 7I is a diagram showing a thin film transistor completed in the third embodiment further covered by a passivation layer.

Please refer to the FIGS. 3K, 5K and 7I, which are diagrams showing the TFT in the first, second, and third embodiments covered by a passivation layer after the active layer is completed. If the TFT in the above embodiments are organic TFTs, a passivation layer 90 may be further deposited on the active layer 80, the source 61, and the drain 62 for preventing the organic material from being permeated by moisture. The passivation layer 90 may be a hydrophilic polymer, a polymer combined hydrophilic and hydrophobic groups or an organic and inorganic mixture that can be manufactured by a spin coating process or a printing process.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A thin film transistor (TFT) device, comprising:
    a substrate structure having a substrate with a first surface and a second surface opposite to the first surface, and a mask disposed on the second surface; and
    a TFT having a source, a drain and a gate, and being disposed on the first surface of the substrate, the source and the drain being in alignment with the mask, wherein the shape, dimensions and vertical position respectively of the mask are the same as the shape, dimensions and vertical position of the source and the drain of the thin film transistor.

2. The TFT device of claim 1, wherein the substrate is a plastic substrate.

* * * * *